US006496548B1

(12) United States Patent
Schneider et al.

(10) Patent No.: US 6,496,548 B1
(45) Date of Patent: Dec. 17, 2002

(54) APPARATUS AND METHOD FOR DECODING ASYNCHRONOUS DATA USING DERIVATIVE CALCULATION

(75) Inventors: David F. Schneider, Melbourne, FL (US); John R. Bestermann, Suwanee, GA (US)

(73) Assignee: Harris Corporation, Melbourne, FL (US)

( * ) Notice: Subject to any disclaimer, the term of this patent is extended or adjusted under 35 U.S.C. 154(b) by 350 days.

(21) Appl. No.: 09/620,009

(22) Filed: Jul. 20, 2000

Related U.S. Application Data

(63) Continuation-in-part of application No. 09/169,517, filed on Oct. 9, 1998, now Pat. No. 6,377,633.

(51) Int. Cl.[7] .............................................. H04L 25/06
(52) U.S. Cl. ..................................... 375/317; 375/316
(58) Field of Search .................................. 375/317, 316, 375/340, 262, 319; 455/226.1; 327/58, 60, 62

(56) References Cited

U.S. PATENT DOCUMENTS

| | | | |
|---|---|---|---|
| 2,999,925 A | 9/1961 | Thomas | 250/8 |
| 3,736,511 A | 5/1973 | Gibson | 325/321 |
| 4,270,208 A | 5/1981 | MacDavid | 375/76 |
| 4,293,949 A * | 10/1981 | Philippides | 714/709 |
| 4,395,773 A * | 7/1983 | Philippides et al. | 375/368 |
| 4,458,322 A | 7/1984 | Veale | 364/571 |
| 4,479,266 A | 10/1984 | Eumurian et al. | 455/608 |
| 4,540,897 A | 9/1985 | Takaoka et al. | 307/268 |
| 4,823,360 A | 4/1989 | Tremblay et al. | 375/4 |
| 4,926,442 A | 5/1990 | Bukowski et al. | 375/76 |
| 5,052,021 A | 9/1991 | Goto et al. | 375/76 |
| 5,180,931 A | 1/1993 | Harada | 307/353 |
| 5,304,854 A * | 4/1994 | Aoki et al. | 327/170 |
| 5,627,860 A | 5/1997 | McKinny et al. | 375/317 |
| 5,706,222 A | 1/1998 | Bonaccio et al. | 364/847 |
| 5,724,035 A | 3/1998 | Sakuma | 341/120 |
| 6,377,633 B1 * | 4/2002 | Schneider | 375/317 |

* cited by examiner

*Primary Examiner*—Chi Pham
*Assistant Examiner*—Khai Tran
(74) *Attorney, Agent, or Firm*—Allen, Dyer, Doppelt, Milbrath & Gilchrist, P.A.

(57) ABSTRACT

An apparatus and method of the present invention allows the digitally decoding of asynchronous communication signals and includes a sampling and storing circuit for sampling a digitally converted asynchronous communication signal and storing sampled signal values corresponding to negative edge signal values, positive edge signal values, and central signal values. A derivative calculating circuit is connected to the sampling of storing circuit for receiving at least negative edge signal values and positive edge signal values and calculating derivatives. A comparator circuit receives the calculated derivatives and compares the derivatives with the threshold based on the calculated negative derivative and produces negative output and positive output values used for determining a decoded output signal.

20 Claims, 7 Drawing Sheets

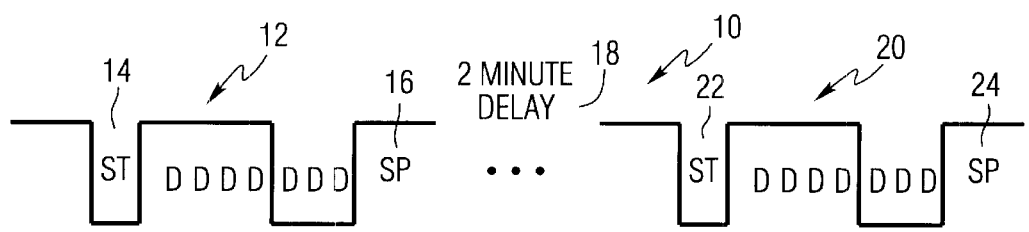
FIG. 1
FIG. 6    AGC SETTLING TIME
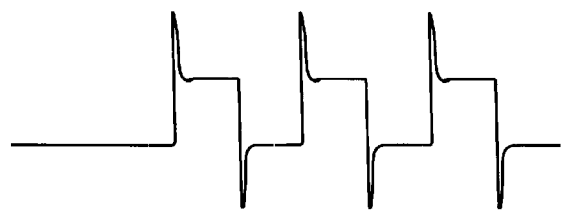
FIG. 7    OVERSHOOT/UNDERSHOOT
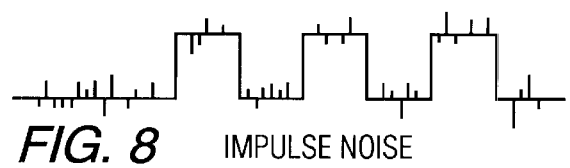
FIG. 8    IMPULSE NOISE
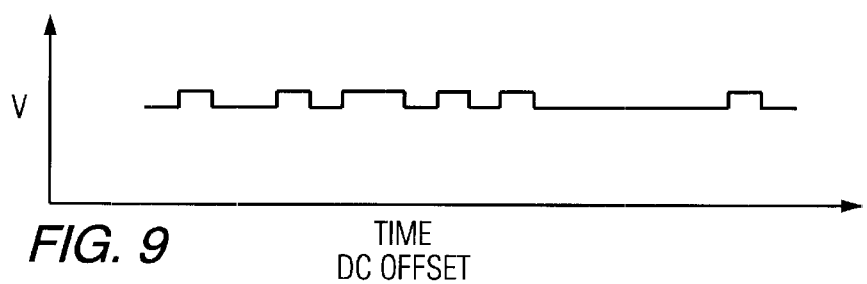
FIG. 9    TIME
DC OFFSET
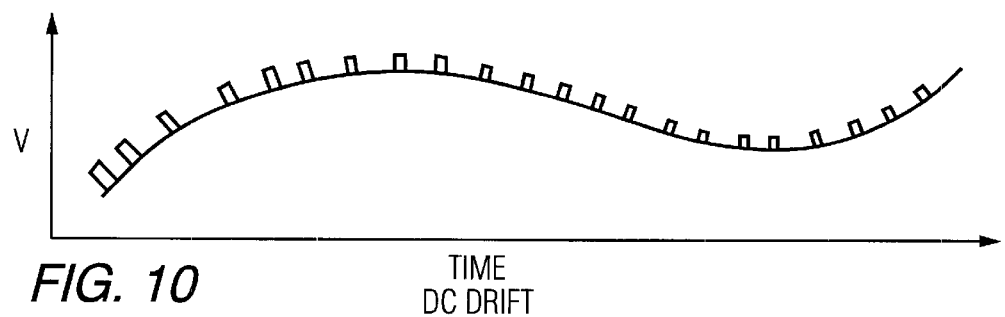
FIG. 10    TIME
DC DRIFT

US 6,496,548 B1

APPARATUS AND METHOD FOR DECODING ASYNCHRONOUS DATA USING DERIVATIVE CALCULATION

RELATED APPLICATION

This application is a continuation-in-part of and commonly assigned U.S. patent application Ser. No. 09/169,517, filed Oct. 9, 1998 now U.S. Pat. No. 6,377,633, the disclosure which is hereby incorporated by reference in its entirety.

FIELD OF THE INVENTION

This invention relates to the field of asynchronous data communications, and more particularly, this invention relates to the field of decoding asynchronous digital data that is sent over a wire line, radio or fiber optic communication channel.

BACKGROUND OF THE INVENTION

In the copending patent application Ser. No. 09/169,517, the problems of asynchronous communication systems and prior art methods for decoding were addressed. In that apparatus, the amplitude of a signal bit having negative and positive peak values was measured and a mid-bit reference computed. Changes in the base band signal peak excursions were tracked and the mid-bit reference was updated from the tracked changes of the base band signal excursions. To track thermal drifts and components aging, the positive and negative peak registers were periodically decremented and incremented, respectfully, at a rate several orders of magnitude slower than the ADC sample rate.

This apparatus addressed asynchronous communication systems that were commonly used where data was not time oriented and was sent in bursts and typically received in a burst receiver.

It is well known that in order to decode incoming data correctly, knowledge of the data amplitude should be ascertained in order to establish a reference within a communications receiver. Any receiver also should typically be capable of performing DC signal restoration during potentially long "quiet" periods. An example of a "quiet" period is shown in FIG. 1, where a frame of data has a stop bit, intermediate data (represented by the letter D) and a stop bit, followed by a two minute signal delay, followed by another frame of data with a start and stop bit and intermediate data (D).

Asynchronous digital data is often sent over a wire line, radio link, or fiber optic communication channel. In some prior art systems, analog implementations have been used for decoding the asynchronous signals. Typically, decoding circuits have been designed to take into consideration the length of a communication line or the link loss. In this type of system, the circuit will restore an analog signal to obtain a digital signal value and then make a decoding decision on the digital signal value. Typically, the circuit is designed based on knowledge of the difference in data amplitude coming into a communications receiver, such as in a fiber optic communications system.

In some prior art applications where the link distance is still known with certainty, the receiver could move even if the transmission distance and theoretical amount of attenuation is known. The link loss, however, would not be known and the signal strength could be variable. In some prior art asynchronous communication systems, designers typically would know the distance between a transmitter and receiver. For example, the communication line could be from room-to-room, or from city-to-city. Once this link distance is known, then the circuit is designed based on the theoretical amount of signal attenuation. There are often times when the amount of signal attenuation cannot be known in a communication line. Also DC signal restoration is difficult.

One of the key aspects of asynchronous data communication is the transmittal of packets or frames. Typically, a burst receiver may be used as mentioned before. In many prior art burst receivers, the receiver will lose its DC reference over a time pause in signal communication, which is why many communication systems use Manchester encoding or pseudo random number generation.

An example of one problem with DC signal restoration is comparing the difference between transmitting asynchronous data over three feet of cable between two computers in the same room, as compared to a longer distance system. In the asynchronous data communication system, if a logical 1 corresponds to five volts and a logical 0 corresponds to zero volts, there would be little problem in finding the midpoint reference or threshold when the data signal is transmitted through only three to five feet of cable. However, if the data signal is transmitted through 100 miles of cable, then the final attenuation would be great and the final signal could be about 100 millivolts. If the ideal threshold was set when only the three foot cable were used (i.e., a threshold of 2.5 volts), that threshold would be insufficient for the 100 mile transmission length and the threshold value would have to be lowered to about 50 millivolts. Thus, it is evident why the threshold in the most basic prior art asynchronous data communication system was set based on the transmission distance.

Some analog devices that are used for measuring the signal attenuation and setting a signal threshold in a receiver have been used with asynchronous data communications, but these systems do not accomplish high dynamic range burst mode asynchronous data decisions because of thermal drifts and parasitic effects of passive and active components.

Other common prior art methods have also been used to establish a signal reference in asynchronous data communication systems.

In a preamble system, several disposable data bits are sent prior to a data payload having the start bit to allow a decision circuit in the communications receiver to establish a signal reference. Thus, as soon as a start bit is transmitted, the circuitry has measured both zero and one logic levels and has set a threshold half-way between the zero and one logic levels.

In a second method known as "avoidance of risk mode of operation," a continuous stream of data is sent with an even mix of ones and zeros by using a randomizing circuit. To avoid a long quiet period, which sometimes occurs such as a two minute delay as shown in FIG. 1, the data is multiplied by a pseudo random number in the transmitter to ensure the data stream is rich in data transitions. Thus, there will always be ones and zeros that are transmitted. Then the communications receiver circuitry decodes the pseudo random number and extracts the information.

In another method known as automatic gain control (AGC), a constant automatic gain control circuit controls the communications receiver gain. For example, if the transmission line is 100 miles long and there is a 100 millivolt threshold, then the signal will be amplified back to five volts. As a result, the system would use a 2.5 volt reference. However, there are time constants. If the system is quiet for extended periods, for example, about two minutes or some other time period, then the signal will decay and there is no signal information on which to make a gain or adjustment of the signal. Thus, the DC signal information is not present.

It is evident that the prior art methods are not adequate in some circumstances. For example, the preamble system reduces the data rate of the channel. As a result, in asynchronous data transmission, the preamble method prevents binary data transfer. Certain characters could be sent as a preamble and would, therefore, not be used for the information content. For example, if bits are sent to a communications receiver in order to synchronize that receiver, then no data information is sent. Thus, the preamble system requires a preamble and prevents binary data transfer. If binary data is transmitted, there could be no start bit. The preamble system would not know the difference between a binary data bit or preamble bit. There could also never be a "sync" word in the binary transmission because it would mistake it for a frame signal. In the "avoidance of the first mode of operation," as noted before, a continuous transmission is required for randomized data. The automatic gain control system (AGC) solves the problem of amplitude fluctuations, but does not solve the problem of DC restoration. In an automatic gain control system, it is possible to correct the gain, but it cannot affect the DC reference point.

Although the apparatus disclosed in copending U.S. patent application Ser. No. 09/169,517 discloses a method and apparatus that decodes asynchronous data signals, that apparatus has not been found feasible with a signal having significant distortions, amplitude variations and DC offsets over a wide dynamic range, such as greater than 40 dB.

SUMMARY OF THE INVENTION

It is therefore an object of the present invention to provide an apparatus and method for decoding asynchronous data signals where the communication link contains unanticipated signal distortions that prevent reliable communication.

In accordance with the present invention, the apparatus digitally decodes asynchronous communication signals and includes a sampling and storing circuit for sampling a digitally converted asynchronous communication signal and storing sampled signal values corresponding to negative edge signal values, positive edge signal values and central signal values. A derivative calculating circuit is connected to the sampling and storing circuit for receiving at least negative edge signal values and positive edge signal values and calculating derivatives. A comparator circuit receives the calculated derivatives and compares the derivatives with a threshold based on a calculated negative derivative and produces negative output and positive output values used for determining a decoded alpha signal.

The derivative calculating circuit includes a plurality of subtraction circuits that receive sampled signal values to calculate a plurality of derivatives. A threshold control circuit is connected to the derivative calculating circuit and receives a derivative calculated from a maximum negative and positive edge signal value. A bit timer receives the negative output and positive output values and times operation of the sampling and storing circuit, derivative calculating circuit and comparator circuit. An automatic gain control circuit is connected to the threshold circuit for receiving compared values of previously stored and decoded output signals. A storage register stores samples of the decoded output signal and an output control circuit receives negative output and positive output values and produces decoded output signals.

A method of the present invention is also disclosed for digitally decoding asynchronous communication signals. A digitally converted asynchronous communication signal is sampled and a plurality of sampled signal values are stored corresponding to negative edge signal values, positive edge signal values and central signal values. The method further comprises the step of calculating derivatives based on sampled signal values and comparing the calculated derivatives for the threshold based on the calculated negative derivative. Negative output and positive output values are produced.

BRIEF DESCRIPTION OF THE DRAWINGS

Other objects, features and advantages of the present invention will become apparent from the detailed description of the invention which follows, when considered in light of the accompanying drawings in which:

FIG. 1 is a representation of an asynchronous communication data transmission that shows a first frame transmission having a start and stop bit and data located between the start and stop bit followed by a two minute delay, and followed, in turn, by a second frame transmission.

FIG. 6 illustrates a signal with automatic gain control settling time.

FIG. 7 illustrates a signal having overshoot/undershoot, such as created by a laser when it first operates.

FIG. 8 illustrates the impulse noise of one signal.

FIG. 9 illustrates DC offset of a signal.

FIG. 10 illustrates the DC drift of a signal.

DETAILED DESCRIPTION OF THE PREFERRED EMBODIMENTS

Figure 2:
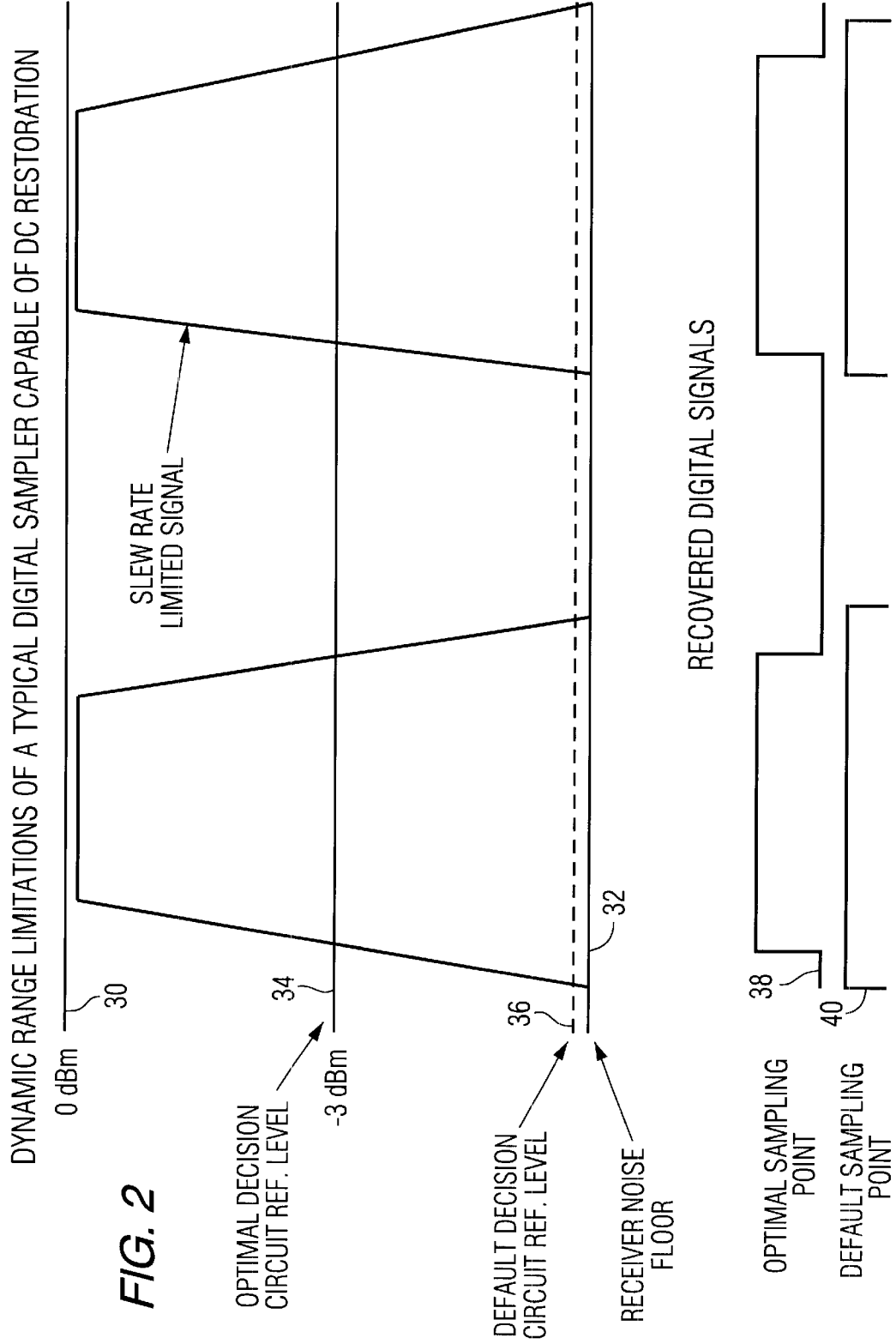
FIG. 2 is a graph showing the dynamic range limitations of a typical digital sampler that is capable of DC restoration with an optimal decision circuit reference level and a default decision circuit reference level where the receiver noise floor is shown by the bottom line.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is advantageous because it now allows decoding of an asynchronous data signal with significant distortions, amplitude variations and DC offsets over a wide dynamic range, such as greater than 50 dB. It solves an interface issue where a communication link contains unanticipated signal distortions that prevent reliable communications. It allows the decoding of asynchronous data in environments with significant overshoot, undershoot, automatic gain control settling time, impulse noise, and amplitude variations because of temperature and component aging, as well as DC offsets. For example, a serial communication link can exist between commercial off-the-shelf (COTS) equipment having a variable, unknown link budget. For example, a 0–200 kilometer fiber optic communication link may have no installation specific configuration. The present invention can be implemented using a FPGA, ADC and limited support circuitry.

For purposes of understanding, a description of the apparatus disclosed in the copending '517 application that solves the decoding of asynchronous communication signals where there are no significant distortions or amplitude variations and DC offsets is described, followed by the apparatus and method of the present invention which does address more adequately these problems.

FIG. 1 illustrates a graphical representation of an asynchronous data frame transmission shown at 10, with a delay that causes a time delay problem. As shown in FIG. 1, asynchronous data communication signals send data in bursts and are not time oriented. For example, a first frame 12 could include a start bit 14 and stop bit 16, with data bits (D) located between the start and stop bit 14,16. The transmission then may have a two minute delay 18 followed by a second frame 20 having a start bit 22 and stop bit 22 and data (D) located between start and stop bits 22,24.

FIG. 2 illustrates a graphical representation of the dynamic range limitations of a typical digital sampler capable of DC restoration. The zero decibel (dBm) line 30 may represent a five volt signal corresponding to a logic level 1, while the logic level 0 at receiver noise floor line 32 could be zero volts and correspond to negative six (−6) decibels. Thus, the optimal decision circuit reference level would be about negative three (−3) decibels at the optimal decision circuit reference level line 34, corresponding to 2.5 volts.

This type of system could be applicable to a fiber optic communication system. The optimal decision circuit reference level 34 is applicable to a short length line or short wire where the same signal would be received with little or no attenuation. Thus, it is possible to use a 2.5 volt reference level, or one-half of the digital five volt level on transmission. If the communication link is "loose," then the signal will be attenuated and the reference would have to be below the negative three (−3) decibel line 34. If it is desirable for this system to work in both situations (i.e., the shorter or longer line), it would then be necessary to place the decision level toward the minimum or "bottom" where the default decision level is located, such as at the default decision circuit reference level indicated by dotted line 36. Thus, it would be possible to work in both situations, i.e., with the short link length with little or no signal attenuation, and the long link length with the much signal attenuation. The graph also shows receiver digital signals for the optimal sampling point at 38 and for the default sampling point at 40.

Figure 3:
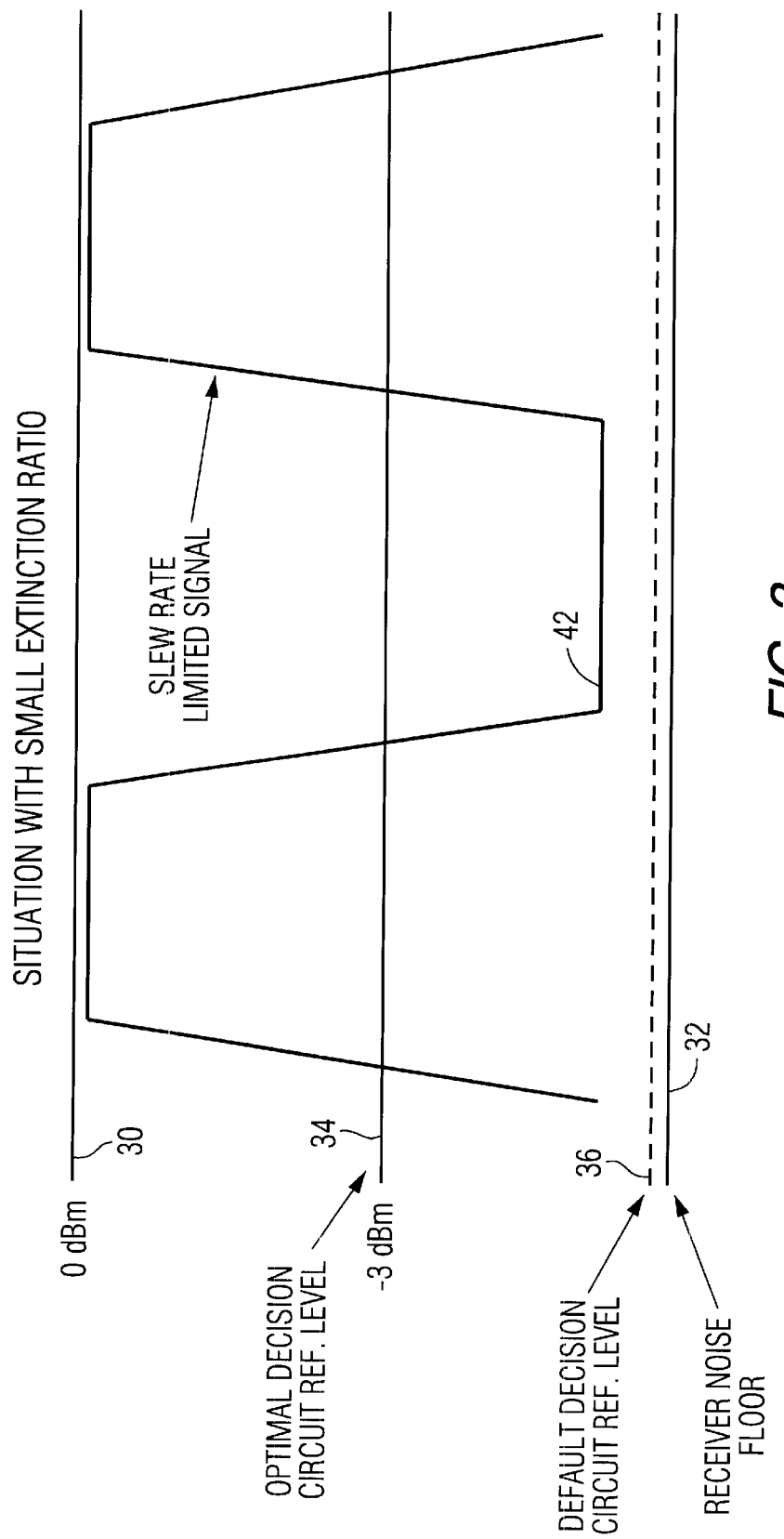
FIG. 3 is a graph similar to the graph of FIG. 2, but showing a signal with a small extinction ratio.

FIG. 3 is another graph similar to FIG. 2, but showing the situation with a small extinction ratio. The term "small extinction ratio" is often used in fiber optic communication systems and points to the relative difference between a "light" state and a "dark" state. If there was a default decision circuit reference level as indicated at 36, and there was a finite extinction ratio, it would never be totally dark, i.e., the signal would never cross that level as shown by the bottom 42 of the signal, which is above the default line 36.

It is evident that it is important to determine the positive level and the negative level and place the threshold in the middle. the extinction ratio is usually defined as a minimum value.

Figure 4:
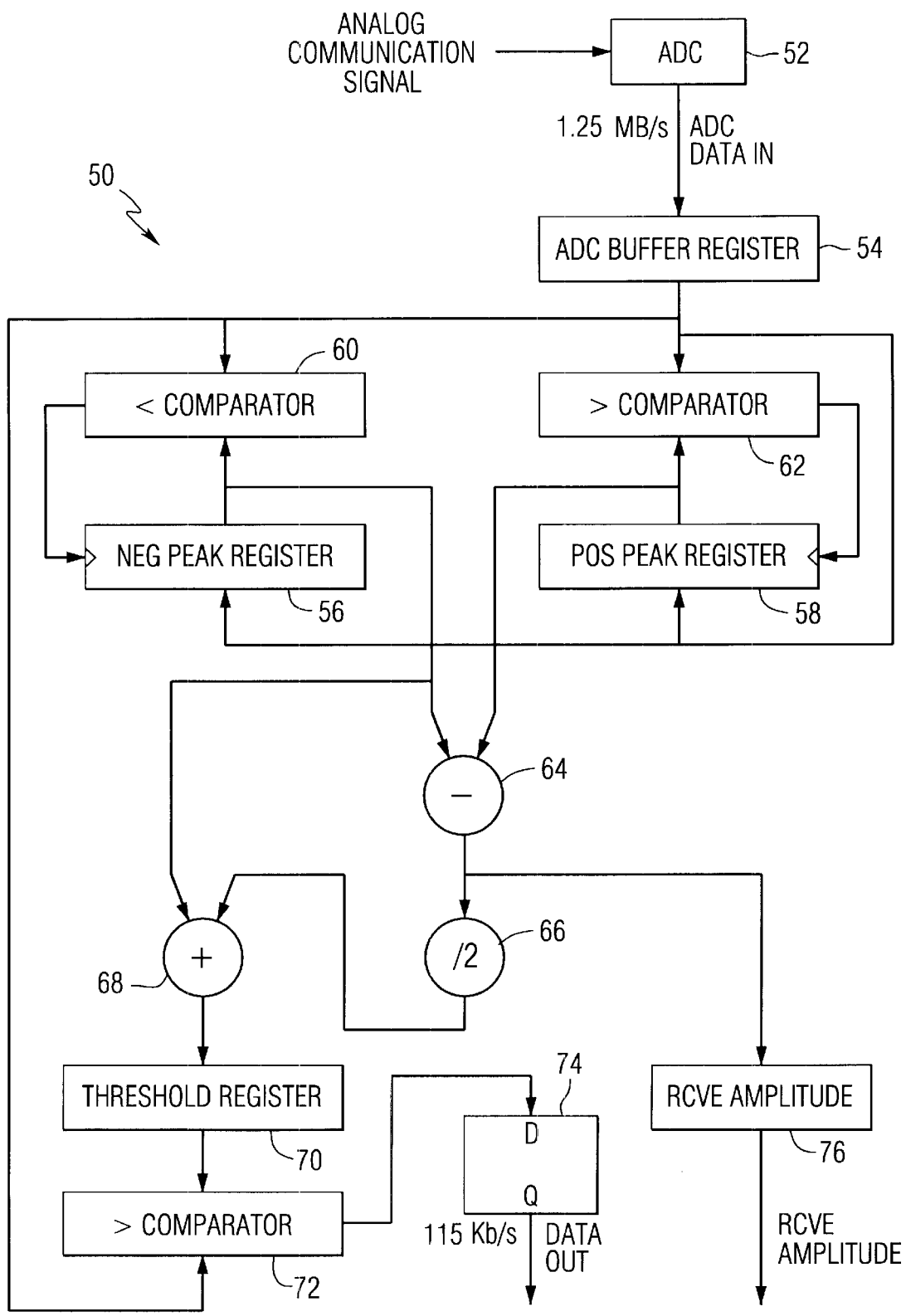
FIG. 4 is a block diagram of the apparatus for digitally decoding asynchronous signals.

In FIG. 4, an analog communication signal that is part of an asynchronous communication transmission passes into an analog-to-digital converter (ADC) 52. Oversampling by the ADC 52 can occur by about ten times, and in the illustrated example, the analog-to-digital converter 52 converts the analog communication signals into binary signal values corresponding to the analog communication signals that have negative and positive peak values for the data information. The binary signal values pass from the ADC 52 in the illustrated embodiment at about 1.25 MB/s, and are stored within the analog-to-digital converter buffer register 54. Although 1.25 MB/s transmission rate is illustrated, any data rate convenient for implementation as known to those skilled in the art is possible. It should be understood that the apparatus does not require a frame preamble, and the first bit of data can be a signal start bit.

The negative and positive peak signal values of the binary signal values are computed by techniques known to those skilled in the art, and stored within a respective negative peak register 56 and a positive peak register 58. As the process continues, a negative peak comparator 60 and positive peak comparator 62 compares the positive and negative peak signal values of a currently received binary signal value with the most negative (the minimum) and most positive (the maximum) peak signal values stored within the negative and positive peak registers, and updates the negative peak register 56 and positive peak register 58 if the current positive and negative peak signal value represent a new minimum negative or maximum positive peak value. The registers are updated accordingly by methods and logical circuit implementations known to those skilled in the art. To track thermal drifts and component aging, the positive and negative peak registers are periodically decremented and incremented, respectfully, at a rate several orders of magnitude slower than the analog-to-digital converter sample rate. The period for the registers could be 1 Hz.

A subtraction circuit 64, working by an operation well known to those skilled in the art, subtracts the positive peak signal value from the negative peak signal value to determine the magnitude signal value corresponding to the difference between a binary zero and one of the binary signal values of the converted analog communication signal. This value then is divided by two within a division circuit 66 to determine the half-magnitude signal value. This one-half magnitude signal value is then added in an addition circuit 68 with the minimum negative peak signal value that is stored in the negative peak register 56 to obtain a threshold signal value. This is shown by the line descending from the negative peak register 56 that then splits and extends to the subtraction circuit 64 and the addition circuit 68.

This threshold signal value is stored within a threshold register 70. This value is used to determine the mid-bit reference. A threshold comparator 72 receives the currently sampled binary signal value from the analog-to-digital converter buffer register 54 and compares that value with the threshold signal value from the threshold register 70. Thus, there occurs a mathematical comparison of the calculated threshold signal value to the currently sampled binary signal value to decide whether the result is greater or less than the computed threshold level as defined by the threshold signal value.

After the comparison, the signal enters the DQ latch 74 that latches a single bit. Thus, the signal is mathematically computed from a 12-bit value (or other N-bit value) to one bit output. The circuit makes the decision whether the comparison is greater than the value in the threshold register 70 or less than that value. Data is transmitted out of the DQ latch 74 at about the reduced rate of 115 KB/s, as compared to the circuit input rate noted above of 1.25 MB/s. Naturally, the data output can vary depending on final design choices made by those skilled in the art. From the subtraction circuit 64, the signal also passes into a receiver amplitude circuit 76 before it is divided. This circuit 76 acts as a diagnostic of the 12-bit value that tells the difference or number of least significant bits (LSB) between a one and zero with the peak-to-peak amplitude signal out.

Figure 5:
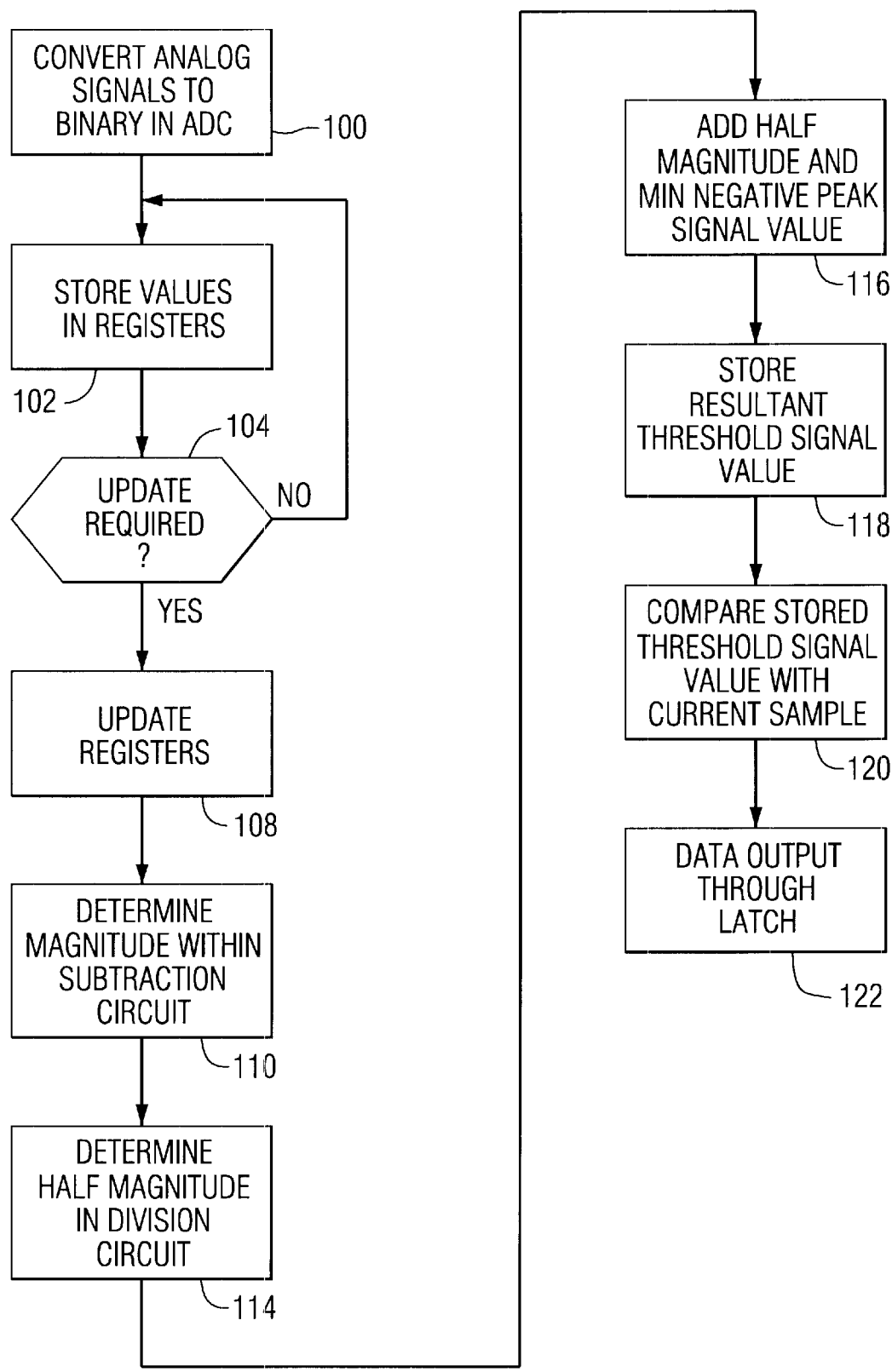
FIG. 5 is a flow chart illustrating a basic method for digitally decoding asynchronous data signals.

FIG. 5 illustrates a basic flow chart of the workings of the apparatus 50. At block 100, analog-to-digital communication signals are converted into binary signal values. The negative and positive peak signal values are stored within the negative peak register 56 and positive peak register 58 at block 102. The comparators 60,62 compare those negative and positive peak signal values with the minimum negative and maximum positive peak signal values stored within those registers at block 104. If the negative and positive peak signal values are either more positive or more negative than what is stored for the minimum or maximum peak signal values, the negative and positive peak registers are updated with the new maximum or minimum values (block 108). If not, the process continues as a loop until the update. The subtraction circuit at block 110 subtracts the positive peak signal value from the negative peak signal value to determine the magnitude signal value. At block 114, the division circuit determines the half magnitude, which is then added in the addition circuit at block 116 to the minimum negative peak signal value stored in the negative peak register. The resultant threshold signal value is stored within the threshold register at block 118, and then compared at block 120 with the currently sampled binary signal value to determine the mid-bit reference. The signal then passes into the latch at block 122.

Although the apparatus and method disclosed in FIGS. 4 and 5 are adequate for decoding asynchronous data where there are not many waveform distortions, it is well known that waveform distortions often occur as shown in the various types of signal waveforms as shown in FIGS. 6–10. FIG. 6 illustrates a waveform signal with automatic gain control settling time. FIG. 7 shows the overshoot/undershoot of a waveform that could occur, such as when a laser first operates. FIG. 8 illustrates the impulse noise that could exist in a signal. FIG. 9 illustrates a DC offset, while FIG. 10 illustrates DC drift. These type of signal and waveform distortions are difficult to decode with the apparatus shown in FIG. 4.

Figure 11:
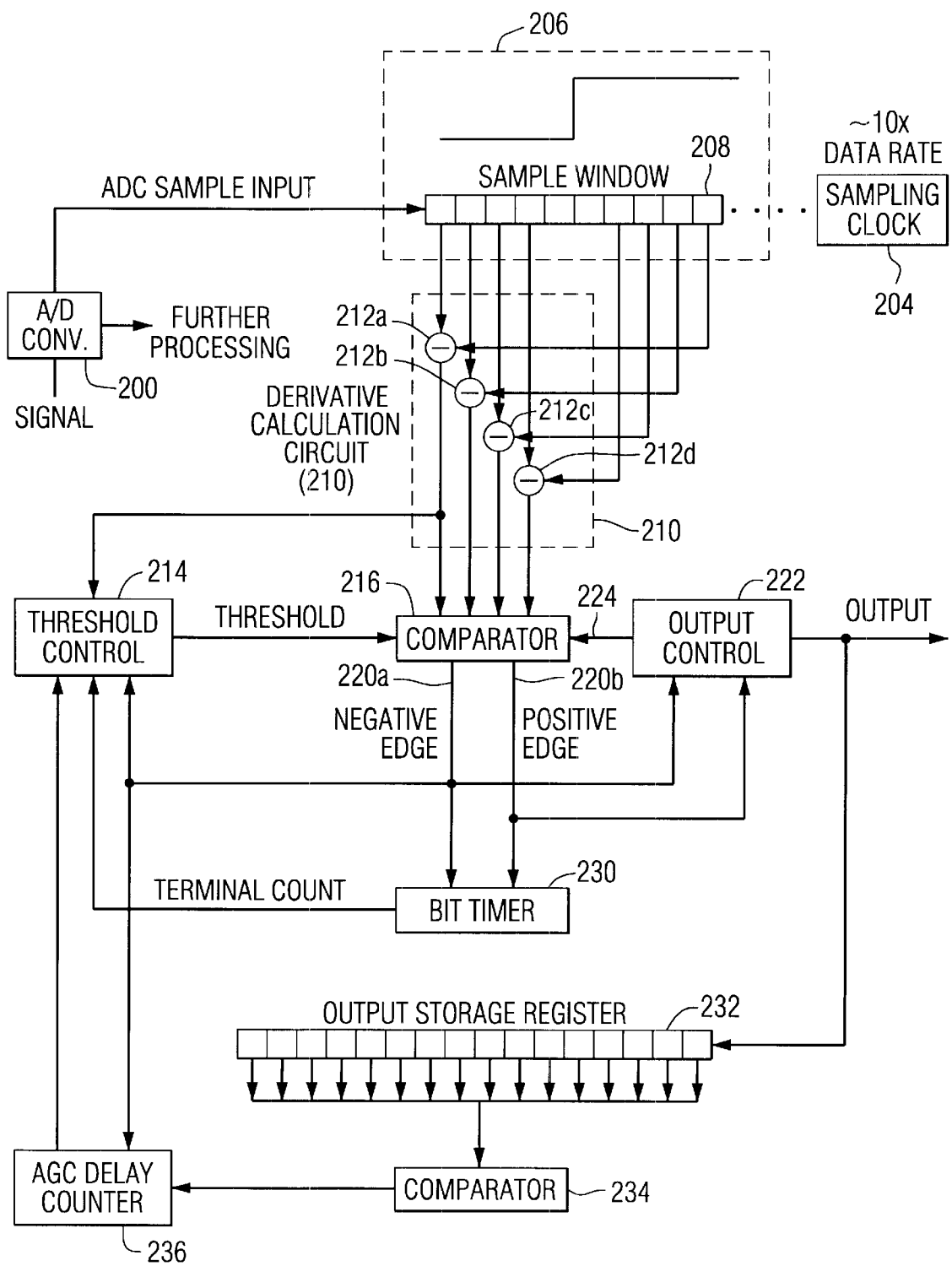
FIG. 11 is a block diagram of the improved apparatus for digitally decoding asynchronous signals, such as shown in FIGS. 6–10, and operable even when various types of waveform distortions occur over a wide dynamic range, such as greater than 40 or 50 dB.

Referring now to FIG. 11, there is shown an improved apparatus of the present invention that allows the decoding of asynchronous data where significant distortions, amplitude variations and DC offsets occur over a wide dynamic range such as greater than 40–50 dB. For purposes of description, the reference numerals begin in the 200 series.

As illustrated, the signal initially passes into an analog/digital converter 200 where the sampling clock 204 times the analog-to-digitally converted signal to be sampled by sampling and storing circuit 206. Ten sample datum corresponding to the signal values of negative edge signal values, positive edge signal values, and central signal values are sampled and stored. The sample window 208 shows ten data storage areas, such as in a register or other storage circuit known to those skilled in the art.

A derivative calculating circuit 210 is connected to the sampling and storing circuit 206 and receives at least the negative edge signal values and positive edge signal values and calculates derivatives. In one aspect of the present invention, the derivative calculating circuit 210 includes a plurality of subtraction circuits 212a, 212b, 212c, 212d that receive the sampled signal values and calculate the derivatives. A threshold control circuit 214 is connected to the derivative calculating circuit 210 and receives a derivative calculated from a maximum negative and positive edge signal value, as shown by the first subtraction circuit 212a. Four subtraction circuits 212a–d are illustrated, and permit the negative edge signal values and positive edge signal values to be processed and their derivatives formed from the maximum to the minimum values as the central signal values are approached. The center samples in the sample window or register allow for edge irregularities. Four derivative calculations must be greater than the derivative threshold to discount impulse noise and runt pulses.

The threshold control circuit 214 is set to a negative derivative at the end of a bit time and after the automatic gain control has settled, as explained below. A threshold signal is sent to the comparator 216, which receives and compares the calculated derivatives with the threshold based on the calculated negative derivative and produces negative output and positive output values 220a, 220b for the edge that are sent to an output control circuit 222 to produce the decoded output signal. The output control circuit 222 also includes a feedback control signal 224 that is fed back to the comparator 216. The negative output and positive output edge values are also forwarded to a bit timer 230 that times the sampling and storing circuit 206, derivative calculating circuit 210, comparator circuit 216, threshold control circuit 214, and other timed circuits. The apparatus components operate in parallel. The decoded output signal is also fed back into an output storage register 232 where a number of samples are stored and then compared in an output comparator 234 and fed to the automatic gain control delay counter 236 that is operative with the threshold control circuit to allow feedback and control for the signals that have many irregularities. Thus, the rate of control is established. As to the comparator and AGC delay counter, the AGC delay counter is loaded after a long period without transitions. At the AGC delay counter, a terminal count occurs after eight negative edges.

Figure 12:
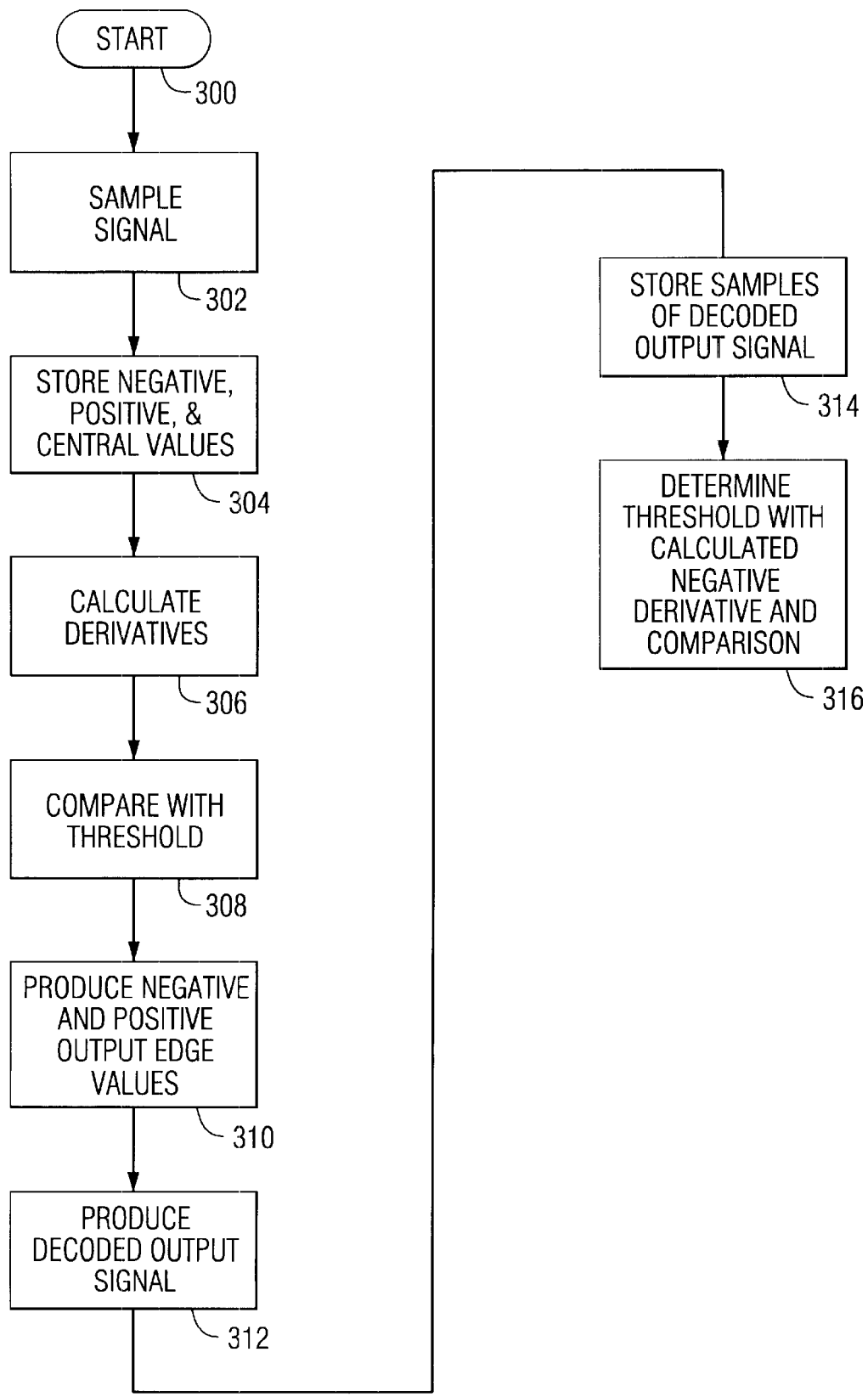
FIG. 12 is a flow chart illustrating the basic method of the present invention using the improved apparatus of FIG. 11.

FIG. 12 illustrates a basic flow chart for the high level processing in the apparatus of the present invention. Reference numerals begin in the 300 series.

As the process starts (block 300), the digitally converted asynchronous communication signal is sampled (block 302). A plurality of sampled signal values are then stored corresponding to negative edge signal values, positive edge signal values and central signal values (block 304). The derivatives are calculated based on the sampled signal values (block 306). The calculated derivatives are compared with a threshold based on a calculated negative derivative (block 308). Negative output and positive output edge values are produced (block 310). A decoded output signal is produced form the negative output and positive output edge values (block 312). Samples of the decoded output signal are stored (block 314), compared, and the result forwarded to the threshold control circuit to determine a threshold based on the calculated negative derivative (block 316).

The present invention as described allows the decoding of asynchronous data in environments with significant overshoot, undershoot, automatic gain control settling time, impulse noise, amplitude variations because of temperature and component aging, and DC offsets. It allows the decoding of signals having a wide dynamic range demonstrated greater than 40–50 dB. The architecture is useful over asynchronous burst communication links having unknown or widely variable length budgets, such as a serial communication link between a commercial off-the-shelf (COTS) equipment and variable, unknown link budgets, such as a 0–200 km fiber optic link with no installation specific configuration.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. An apparatus for digitally decoding asynchronous communication signals comprising:
   a sampling and storing circuit for sampling a digitally converted asynchronous communication signal and storing sampled signal values corresponding to negative edge signal values, positive edge signal values and central signal values;
   a derivative calculating circuit connected to said sampling and storing circuit for receiving at least negative edge signal values and positive edge signal values and calculating derivatives; and
   a comparator circuit for receiving the calculated derivatives and comparing the derivatives with a threshold based on a calculated negative derivative and producing negative output and positive output values used for determining a decoded output signal.

2. An apparatus according to claim 1, wherein said derivative calculation circuit comprises a plurality of subtraction circuits that receive sampled signal values to calculate a plurality of derivatives.

3. An apparatus according to claim 2, and further comprising a threshold control circuit connected to said derivative calculating circuit for receiving a derivative calculated from a maximum negative and positive edge signal value.

4. An apparatus according to claim 3, and further comprising a bit timer for receiving the negative output and positive output values and timing the sampling and storing circuit, derivative calculating circuit and comparator circuit.

5. An apparatus according to claim 3, and further comprising an automatic gain control circuit connected to said threshold circuit for receiving compared values of previously stored output signals.

6. An apparatus according to claim 1, and further comprising a storage register for storing samples of the decoded output signal.

7. An apparatus according to claim 1, and further comprising an output control circuit for receiving negative output and positive output values and producing the decoded output signal.

8. An apparatus for digitally decoding asynchronous communication signals comprising:
   a sampling and storing circuit for sampling a digitally converted asynchronous communication signal and storing sampled signal values corresponding to negative edge signal values, positive edge signal values and central signal values;
   a derivative calculating circuit connected to said sampling and storing circuit for receiving at least negative edge signal values and positive edge signal values and calculating derivatives; and
   a comparator circuit for receiving the calculated derivatives and comparing the derivatives with a threshold based on a calculated negative derivative and producing negative output and positive output values;
   an output control circuit for receiving the negative output and positive output values and producing a decoded output signal and a feedback control signal to the comparator circuit.

9. An apparatus according to claim 8, wherein said derivative calculating circuit comprises a plurality of subtraction circuits that receive sampled signal values to calculate a plurality of derivatives.

10. An apparatus according to claim 9, and further comprising a threshold control circuit connected to said derivative calculating circuit for receiving a derivative calculated from a maximum negative and positive edge signal value.

11. An apparatus according to claim 10, and further comprising a bit timer for receiving the negative and positive output values and timing the sampling and storing circuit, derivative calculating circuit and comparator circuit.

12. An apparatus according to claim 10, and further comprising an automatic gain control circuit connected to said threshold circuit for receiving compared values of previously stored decoded output signals.

13. An apparatus according to claim 8, and further comprising a storage register for storing samples of the decoded output signal.

14. An apparatus for digitally decoding asynchronous communication signals comprising:
   a sampling and storing circuit for sampling a digitally converted asynchronous communication signal and storing sampled signal values corresponding to negative edge signal values, positive edge signal values and central signal values;
   a derivative calculating circuit connected to said sampling and storing circuit for receiving at least negative edge signal values and positive edge signal values and calculating derivatives;
   a threshold control circuit connected to said derivative calculating circuit for receiving a derivative calculated from a maximum negative and positive edge signal value;
   a comparator circuit connected to said derivative calculating circuit and the threshold control circuit for receiving the calculated derivatives and comparing the derivatives with a threshold based on a calculated negative derivative and producing negative output and positive output values;
   an output control circuit for receiving the negative output and positive output values and producing a decoded output signal and a feedback control signal to the comparator circuit;
   a storage register for receiving and storing samples of the decoded output signal; and
   an output comparator circuit for comparing samples of the decoded output signal and producing a comparison signal to said threshold control circuit.

15. An apparatus according to claim 14, wherein said derivative calculating circuit comprises a plurality of subtraction circuits that receive sampled signal values to calculate a plurality of derivatives.

16. An apparatus according to claim 15, and further comprising a bit timer for receiving the negative output and positive output values and timing the sampling and storing circuit, derivative calculating circuit and comparator circuit.

17. An apparatus according to claim 16, and further comprising an automatic gain control circuit connected to said threshold circuit for receiving compared values of previously stored decoded output signals.

18. A method for digitally decoding asynchronous communication signals comprising the steps of:

sampling a digitally converted asynchronous communication signal;

storing a plurality of sampled signal values corresponding to negative edge signal values, positive edge signal values and central signal values;

calculating derivatives based on the sampled signal values;

comparing the calculated derivatives with a threshold based on a calculated negative derivative; and outputting negative output and positive output values.

19. A method according to claim 18, and further comprising the step of producing a decoded output signal from the negative output and positive output values.

20. A method according to claim 19, and further comprising the step of storing samples of the decoded output signal and comparing the stored samples of the decoded output signal for determining a threshold based on a calculated negative derivative.

* * * * *